(12) United States Patent
He et al.

(10) Patent No.: US 7,371,101 B2
(45) Date of Patent: May 13, 2008

(54) ELECTRICAL CONNECTOR

(75) Inventors: Wen He, Shenzhen (CN); Cong-Ya Han, Shenzhen (CN); Jian-Feng Shen, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/504,283

(22) Filed: Aug. 15, 2006

(65) Prior Publication Data

US 2007/0035319 A1 Feb. 15, 2007

(30) Foreign Application Priority Data

Aug. 15, 2005 (CN) .................. 2005 2 0074617 U

(51) Int. Cl.
*H01R 4/50* (2006.01)

(52) U.S. Cl. ....................................... 439/342
(58) Field of Classification Search ................ 439/342, 439/259, 264

See application file for complete search history.

(56) References Cited

U.S. PATENT DOCUMENTS

| 6,338,640 | B1 * | 1/2002 | Lin | 439/342 |
| 6,609,926 | B1 * | 8/2003 | Chen et al. | 439/342 |
| 6,712,634 | B1 * | 3/2004 | McClinton | 439/342 |

\* cited by examiner

*Primary Examiner*—Phuong Dinh
(74) *Attorney, Agent, or Firm*—Wei Te Chung

(57) ABSTRACT

An electrical connector comprising: a stationary base (6) with a plurality of passageways therein, a plurality of terminals (5) respectively received within the corresponding passageways, a moveable cover (7) slidably mounted upon the base and defining a plurality of passages in alignment with the corresponding passageways, respectively, a bottom plate (91) stationarily retained to the base (6), a cam actuator (8) extending through the cover (7), the bottom plate (91), the base (6), wherein the base (6) defines a recess (630) for receiving the bottom plate (91) therein, the recess (630) defines at least one first obstructing portion (631), the bottom plate (91) comprises a base portion (911) and a concave portion (912) corresponding to the at least one first obstructing portion (631), in assembly the concave portion (912) is inserted into the obstructing portion (631).

2 Claims, 4 Drawing Sheets

US 7,371,101 B2

ELECTRICAL CONNECTOR

BACKGROUND OF THE INVENTION

1. Field of the Invention

The present invention relates to an electrical connector adapted for electrically interconnecting a chip module with a circuit board, and more particularly to an electrical connector having a protecting mechanism.

2. Description of Related Art

A conventional electrical connector 1' related to the present invention usually includes a rectangular base 6', a rectangular cover 7' movable on the base 6', and a driving device extending through and attached on the base 6' and the cover 7'. The cover 7' is adapted to support a chip module, while the base 6' is adapted to mount on a circuit board. The driving device comprises a rotary cam 8' a washer 9', and a riveting pad 10'. The cam 8' which can be rotated to drive the cover 7' to slide relative to the base 6'.

The base 6' comprises a base portion 61', a base platform 62' and a base hole 620' formed on the base platform 62' for receiving the cam 8' therein.

The cover 7' is mounted on the base 6' and comprises a cover base 71' and a cover platform 72'. The cover 7' defines a cover hole 720' in alignment with the base hole 620' for receiving the cam 8' therein. In addition, the cover 7' defines a receiving recess (not labeled) for receiving the washer 9' on a surface facing the base 6'. The recess defines a receiving hole (not labeled) in line with the cover hole 720' for receiving the cam 8'.

The cam 8' comprises a plurality of cylinders with decreasing diameter. The washer 9' defines a receiving portion 91' for receiving the cam 8' therein.

In assembly, the washer 9' firstly is mounted in the cover 7', and then the cover 7' with the washer 9' is mounted on the base 6'. Successively, the cam 8' is inserted through the cover 7' and the base 6' from a top side of the cover 7'. At last, a lower end of the cam 8' is riveted with the riveting pad 10', hence the cover 7' and the base 6' are mounted together and the cam 8' can drive the cover 7' slide relative to the base 6'.

In the electrical connector abovementioned, the washer 9' is configured with an identical thickness. When the washer 9' is mounted into the cover 7', the engagement strength is only provided by a small envelopment surface that the recess engages with the washer 9'. In this case, the washer 9' may fall off improperly or even fail to slide.

To overcome above-mentioned problems, an improved connector is desired.

SUMMARY OF THE INVENTION

Accordingly, the object of the present invention is to provide an electrical connector having an improved connection effect between the electrical connector and the printed circuit board.

In order to achieve the above-mentioned object, an electrical connector in accordance with the present invention comprises an insulative base, a dielectric cover, a plurality of electrical contacts, a metallic cam actuator, a protecting mechanism comprising a cover plate and a bottom plate, and a washer. The base comprises an insulative housing and a base platform, an opening and a plurality of passageways. The base platform comprises a T-shaped recess in the middle of an end thereof. The bottom of the recess defines a through hole. The cover comprises an insulative housing, an opening and a ledge, the ledge defines a T-shaped concave. The protecting mechanism comprises a T-shaped metal cover plate insert molded in the T-shaped recess of the cover and a T-shaped metal bottom plate insert molded in the T-shaped concave of the housing. The cover plate is configured as a stepped structure and comprises a body portion and an indented portion. The T-shaped recess extends a pair of second obstructing portions from a sidewall on a back end thereof engaged with the cover plate and separated with a bottom surface of the recess. The T-shaped concave comprises a pair of second obstructing portions extending from a sidewall on a back end thereof and spaced from a bottom surface thereof. In assembly, the cover plate is insert molded in the T-shaped of the concave of the cover with the indented portion engaged with the first obstructing portion. The bottom plate is insert molded in the T-shaped recess of the base and the concave portion engaged with the second obstructing portion.

Relative to the conventional art, the electrical connector disposes a indented portion engaged with the first obstructing portion and the concave portion engaged with the second obstructing portion, which adds enveloping surfaces between the cover plate and the cover, the bottom plate and the base. So, when the cam derives the cover sliding relative to the housing, the engagement between the cover plate and the cover, the bottom plate and the base become more reliable and stable, which prevents the cover slide around relative to the housing due to the relative loose between the cover plate and the cover, the bottom plate and the base.

Other objects, advantages and novel features of the invention will become more apparent from the following detailed description of the present embodiment when taken in conjunction with the accompanying drawings.

DETAILED DESCRIPTION OF THE INVENTION

Reference will now be made in detail to the preferred embodiment of the present invention.

Figure 1:
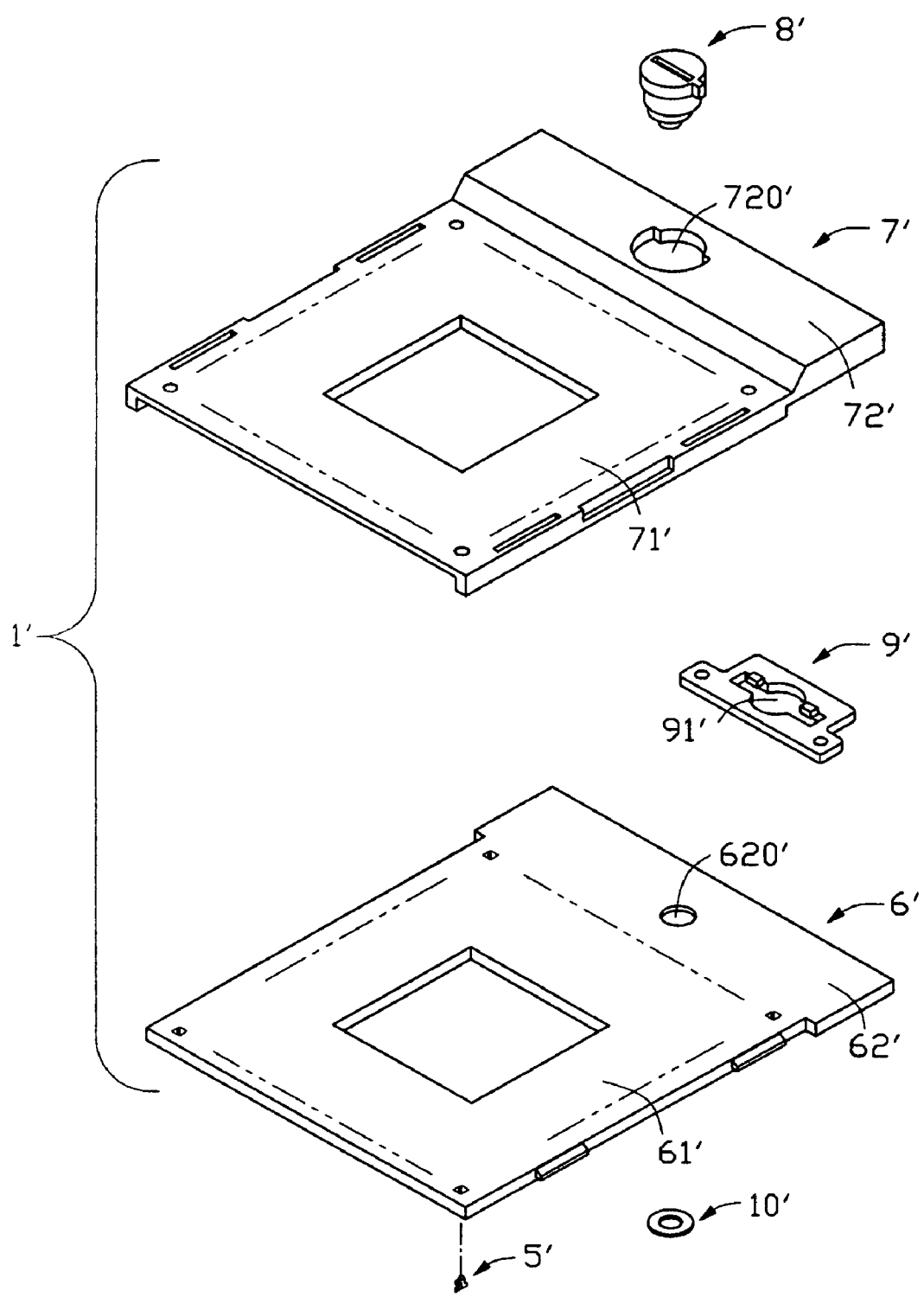
FIG. 1 is an exploded, perspective view of a conventional electrical connector.
Figure 2:
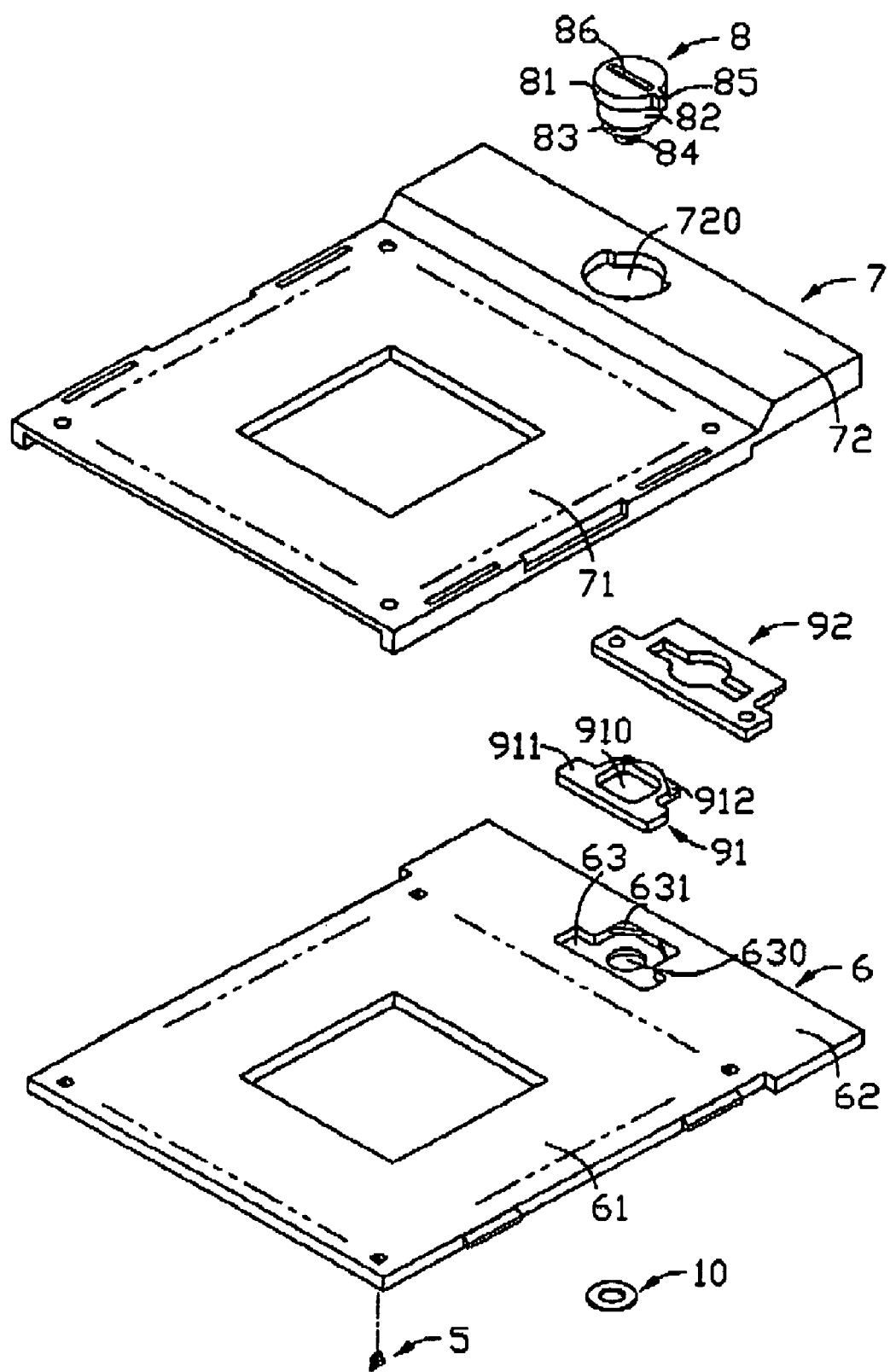
FIG. 2 is an exploded, perspective view of an electrical connector in accordance with the present invention.

Referring to FIGS. 1 and 2, an electrical connector in accordance with the present invention comprises an insulative base 6, a dielectric cover 7, and a plurality of electrical contacts 5, a metallic cam actuator 8, a protecting mechanism comprising a cover plate 92 and a bottom plate 91, and a washer 10.

The base 6 is generally in the shape of a square and comprises an insulative housing 61 and an extending platform 62 extending from the housing 61 in a from-to-back direction, an opening (not labeled) defined in the middle of the insulative housing 61 and a plurality of passageways extending vertically through the insulative housing 61 to receive the plurality of contacts 5 therein. The insulative housing 61 comprises a T-shaped recess 63 in the middle of an end thereof. The bottom of the recess 63 defines a through hole 630. The T-shaped recess 63 extends a pair of first obstructing portions 631 from a back sidewall thereof engaged with the base plate 61 and separated with a bottom surface of the recess 63. Each first obstructing portion 631 is generally formed as a triangle shape and extending from a corner adjacent to the back sidewall of the recess 63.

The cover 7 has a shape corresponding to that of the base 6 and comprises an insulative housing 71, an opening (not labeled) defined in the middle of the insulative housing 71 and a ledge 72 defined at one end thereof. A plurality of passages (not labeled) extends through the insulative housing 71 in alignment with the passageways of the base 6. The ledge 72 defines a top hole 720 in the middle thereof. The top hole 720 consists of two semicircle-shaped holes (not labeled) of different diameters. In addition, the ledge 72 further comprises a T-shaped concave 73 for receiving the cover plate 92 therein. The T-shaped concave 73 comprises a pair of second obstructing portions 731 extending from a back sidewall thereof and spaced from a bottom surface thereof. The second obstructing portion 731 is generally formed as a triangle shape.

Figure 3:
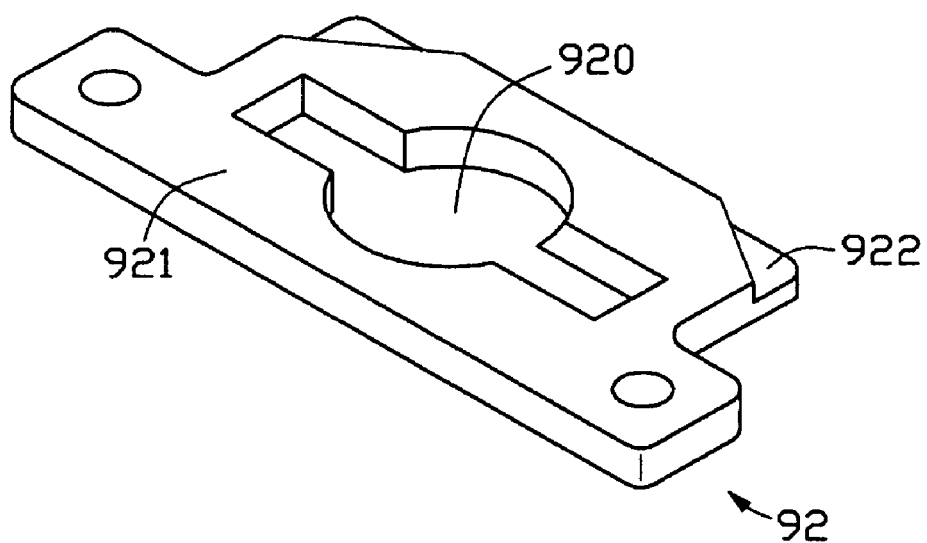
FIG. 3 is a bottom view of the driving cam of FIG. 2.
Figure 4:
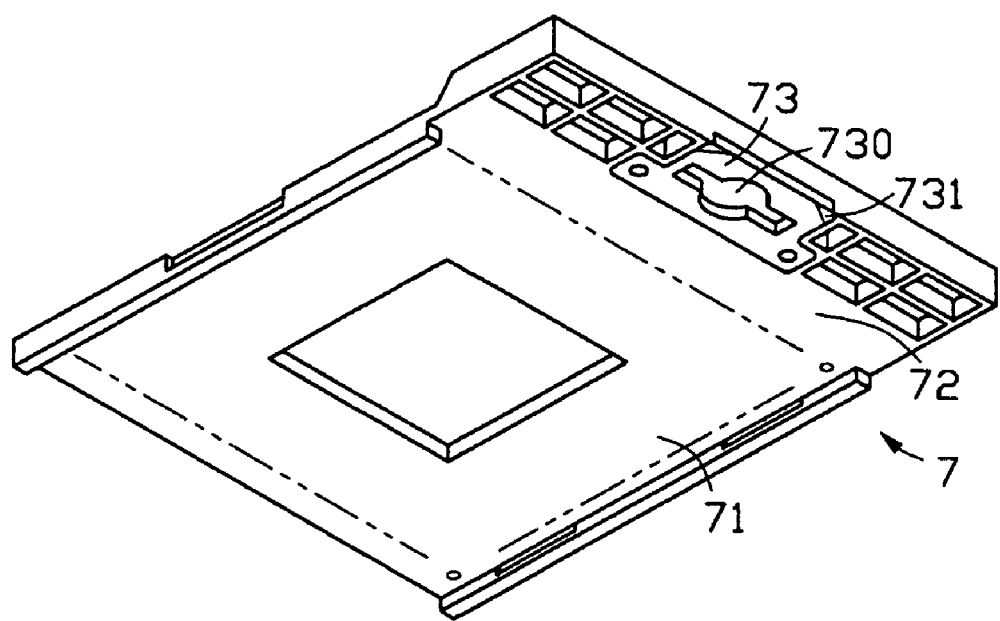
FIG. 4 is a bottom view of the cover assembled the cover plate of FIG. 2.
Figure 5:
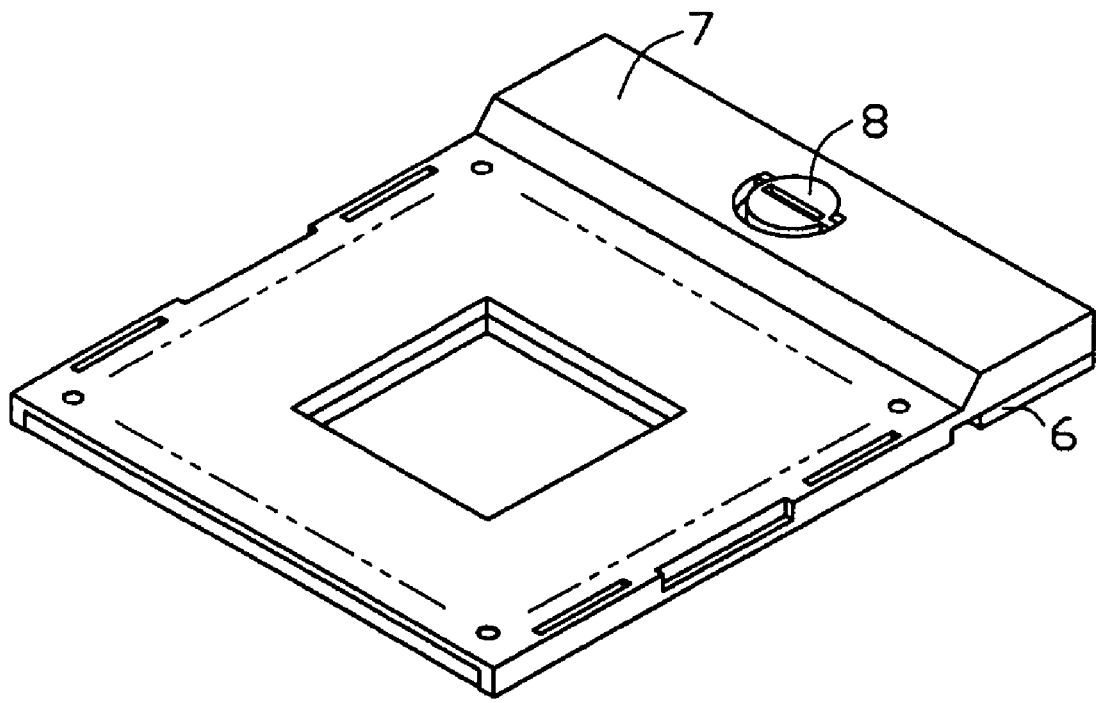
FIG. 5 is an assembled, perspective view of FIG. 2.

The protecting mechanism comprises a T-shaped metal cover plate 92 insert molded in the cover 7 (referring to FIG. 3) and a T-shaped metal bottom plate 91 received in the recess 63 of the base 6. The cover plate 92 is configured as a stepped structure and comprises a body portion 921 and an indented portion 922. The body portion 921 defines an elongated slot 920 in the middle thereof. The body portion 921 also defines a pair of small holes for orientation of the cover plate 92 insert molded in the cover 7. The bottom plate 91 defines a rectangular or capsular through hole 910 in the middle thereof and comprises a base portion 911 and a concave portion 912.

The cam actuator 8 comprises an upper disk 81, a lower disk 82 and a lower cam block 83. The upper disk 81 is coaxial with the lower disk 82 and has a diameter larger than the lower disk 82. The upper disk 81 defines an elongated groove 86 recessed in an upper surface thereof and comprises an outwardly protruding protrusion 85. The elongated groove 86 has two closed opposing longitudinal ends. Thus, a tool such as a screwdriver (not shown) can be confinedly fitted into the groove 86 to exert a rotation force on the cam actuator 8, without the possibility that the tool may slide along the groove 86 beyond the periphery of the upper disk 81. The cam block 83 is formed beneath the lower disk 82 and comprises a riveting end 84 coaxial with the cam block 83 at a lower end thereof. A rotational axis of the cam block 83 is offset from a rotational axis of the lower disk 82.

Referring to FIGS. 1 to 4, in assembly, first, the bottom plate 91 is received in the recess 63 of the base 6. Second, the cover 7 together with insert molded the cover plate 92 is assembled onto the base 6. Successively, the cam actuator 8 is mounted into the connector from the top via the top holes 720 and then through the elongated slot 920 and the through holes 910. The cam block 83 of the cam actuator 8 extends through the rectangular through hole 910 of the bottom plate 91 and the riveting end 84 thereof is riveted with the washer 10 attached on a lower surface of the base 6, whereby the cam actuator 8, the cover 7, the base 6, and the washer 10 are assembled together. When the electrical connector is assembled, the indented portions 922 of the cover plate 92 are engaged with the second obstructing portions 731 and the concave portions 912 of the bottom plate 91 are engaged with the first obstructing portions 631, which improve the engagement situation between the cover 7 and the cover plate 92. Thus the base 6 and the bottom plate 91 can prevent the cover plate 92 and the bottom plate 91 from sliding off from the cover 7 and the base 6. So the cam actuator 8 can actuate the cover 7 slide relative to the base 6 more stably and reliably. The cover plate 92 and the bottom plate 91 can also enhance the retention between the base 6 and the cover 7.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector comprising:
    a base comprising a plurality of passageways and a recess defining at least one first obstructing portion on an end thereof;
    a cover slidably assembled to the base and a plurality of passages in alignment with the passageways of the base;
    a cam actuator rotatably interengaged between the base and the cover so as to drive the cover along the base; and
    wherein the cam actuator further includes a bottom plate inserted into the recess of the base, the bottom plate having a bottom surface which is at least partially enclosed by the first obstructing portion of the base, wherein the bottom plate defines at least one concave portion in relative to the first obstructing portion, in assembly the first obstructing portion engages with the concave portion, wherein further comprises a cover plate defining at least one triangular indented portion, and the cover defines a triangular concave portion for receiving the cover plate comprising at second obstructing portions in relative to at least one indented portion, the indented portion engaged with the second obstructing portion, wherein the bottom plate is configured as a T-shaped structure, and at least one concave portion is two which are formed on corners on a back end of the bottom plate, wherein the cover plate is configured as a T-shaped structure and at least one indention portion is two which are formed on corners on a back end of the bottom plate, wherein further comprising a washer, the washer riveting the riveting end of the earn actuator for assembling the cam actuator to the cover and the base, wherein the earn actuator comprises an upper disk, a lower disk and a lower earn block, the lower cam block comprising a riveting end coaxial with the cam block at a lower end thereof, wherein the upper disk is coaxial with the lower disk and the cam block is formed beneath the lower disk and has a rotational axis offset from that of the upper disk, wherein the upper disk defines an elongated groove recessed in an upper surface thereof, wherein the cover comprises a concave portion receiving a cover plate defining an indented portion, the concave portion defines a second obstructing portion, the indented portion engaged with the second obstructing portion, wherein the cover has a shape corresponding to that of the base and comprises an insulative housing, an opening defined in a middle of the insulative housing, and a ledge at one end thereof.

2. An electrical connector comprising:
    a stationary base with a plurality of passageways therein;
    a plurality of terminals respectively received within the corresponding passageways;

a moveable cover slidably mounted upon the connector and defining a plurality of passages in alignment with the corresponding passageways, respectively;

a protecting mechanism positioned between said cover and said base, said protecting mechanism including a cover plate moveable along with the cover, and a bottom plate stationarily retained to the base; and a cam actuator extending through both the cover plate and the bottom plate;

wherein the base defines a recess for receiving the bottom plate therein, the recess defines at least one first obstructing portion, the bottom plate comprises a base portion and a concave portion corresponding to the at least one first obstructing portion, in assembly the concave portion is inserted into the first obstructing portion, wherein the bottom plate defines at least one concave portion in relative to the first obstructing portion, in assembly the first obstructing portion engages with the concave portion, wherein further comprises a cover plate defining at least one triangular indented portion, and the cover defines a triangular concave portion for receiving the cover plate comprising at second obstructing portions in relative to at least one indented portion, the indented portion engaged with the second obstructing portion, wherein the bottom plate is configured as a T-shaped structure, and at least one concave portion is two which are formed on corners on a back end of the bottom plate, wherein the cover plate is configured as a T-shaped structure and at least one indention portion is two which are formed on corners on a back end of the bottom plate, wherein further comprising a washer, the washer riveting the riveting end of the earn actuator for assembling the cam actuator to the cover and the base, wherein the earn actuator comprises an upper disk, a lower disk and a lower earn block, the lower cam block comprising a riveting end coaxial with the cam block at a lower end thereof, wherein the upper disk is coaxial with the lower disk and the cam block is formed beneath the lower disk and has a rotational axis offset from that of the upper disk, wherein the upper disk defines an elongated groove recessed in an upper surface thereof, wherein the cover comprises a concave portion receiving a cover plate defining an indented portion, the concave portion defines a second obstructing portion, the indented portion engaged with the second obstructing portion, wherein the cover has a shape corresponding to that of the base and comprises an insulative housing, an opening defined in a middle of the insulative housing, and a ledge at one end thereof.

* * * * *